United States Patent
Zhao et al.

(10) Patent No.: US 12,389,708 B2
(45) Date of Patent: Aug. 12, 2025

(54) METHOD FOR IMPROVING THE OHMIC CONTACT BEHAVIOR BETWEEN A CONTACT GRID AND AN EMITTER LAYER OF A SILICON SOLAR CELL

(71) Applicants: CE CELL ENGINEERING GMBH, Kabelsketal (DE); FRAUNHOFER-GESELLSCHAFT ZUR FÖRDERUNG DER ANGEWANDTEN FORSCHUNG EINGETRAGENER VEREIN, Munich (DE)

(72) Inventors: Hongming Zhao, Halle/Saale (DE); Stefan Stöckel, Radebeul (DE); Eckehard Hofmüller, Rieda (DE); Eve Krassowski, Großbadest (DE); Marko Turek, Halle (DE); Christian Hagendorf, Halle (DE); Stephan Grosser, Halle (DE)

(73) Assignees: CE CELL ENGINEERING GMBH, Kabelsketal (DE); FRAUNHOFER-GESELLSCHAFT ZUR FÖRDERUNG DER ANGEWANDTEN FORSCHUNG EINGETRAGENER VEREIN, Munich (DE)

( * ) Notice: Subject to any disclaimer, the term of this patent is extended or adjusted under 35 U.S.C. 154(b) by 454 days.

(21) Appl. No.: 17/996,373

(22) PCT Filed: Apr. 1, 2021

(86) PCT No.: PCT/DE2021/000070
§ 371 (c)(1),
(2) Date: Oct. 17, 2022

(87) PCT Pub. No.: WO2021/209082
PCT Pub. Date: Oct. 21, 2021

(65) Prior Publication Data
US 2023/0335668 A1 Oct. 19, 2023

(30) Foreign Application Priority Data
Apr. 17, 2020 (DE) .................... 10 2020 002 335.5

(51) Int. Cl.
*H10F 71/00* (2025.01)
*H02S 50/15* (2014.01)
*H10F 77/20* (2025.01)

(52) U.S. Cl.
CPC .......... *H10F 71/128* (2025.01); *H02S 50/15* (2014.12); *H10F 71/00* (2025.01); *H10F 71/121* (2025.01); *H10F 77/211* (2025.01); *Y02E 10/52* (2013.01); *Y02E 10/547* (2013.01); *Y02P 70/50* (2015.11)

(58) Field of Classification Search
CPC ...... H10F 71/128; H10F 77/211; H10F 71/00; H10F 71/121; H02S 50/15; Y02E 10/52; Y02E 10/547; Y02P 70/50; H01L 31/186; H01L 31/1804; H01L 31/022425; H01L 31/1864
See application file for complete search history.

(56) References Cited

U.S. PATENT DOCUMENTS

| | | | | |
|---|---|---|---|---|
| 11,393,944 | B2 * | 7/2022 | Hongming | ............ H10F 19/908 |
| 11,482,630 | B2 * | 10/2022 | Zhao | .................... H10F 71/121 |
| 11,784,263 | B2 * | 10/2023 | Zhao | .................... H10F 71/00 438/88 |
| 2020/0365746 | A1 * | 11/2020 | Zhao | .................... H10F 10/14 |
| 2022/0149225 | A1 * | 5/2022 | Frigge | .................... H10F 71/10 |
| 2023/0010820 | A1 * | 1/2023 | Zhao | .................... H10F 10/14 |
| 2023/0335668 | A1 * | 10/2023 | Zhao | .................... H02S 50/15 |

FOREIGN PATENT DOCUMENTS

| | | | | | |
|---|---|---|---|---|---|
| DE | 102016009560 | A1 | * | 2/2018 | ..... H01L 31/022425 |
| DE | 102018001057 | A1 | * | 8/2019 | ..... H01L 31/022425 |
| DE | 102016009560 | B4 | * | 9/2022 | ..... H01L 31/022425 |
| JP | 2019525471 | A | * | 9/2019 | ..... H01L 31/022425 |

OTHER PUBLICATIONS

"International Search Report issued in PCT/DE2021/000070 on Sep. 9, 2021".

* cited by examiner

*Primary Examiner* — Earl N Taylor
(74) *Attorney, Agent, or Firm* — Blank Rome LLP

(57) ABSTRACT

The invention relates to a method for improving the ohmic-contact behaviour between a contact grid and an emitter layer of a silicon solar cell, in which, in a treatment step, a treatment current flow having a current density of 200 A/cm$^2$ to 20,000 A/cm$^2$ in relation to the treatment section is induced while biasing and illuminating the silicon solar cell. The object of the invention is to improve the method for improving the ohmic-contact behaviour between a contact grid and an emitter layer of a silicon solar cell. In particular, it should be possible to quantify the improvement achieved by the method while implementing the method. Furthermore, any damage resulting from the application of unfavourable process parameters should be detected while the method is being implemented. This object is achieved in that a measurement step is carried out before and/or after the treatment step, and, in said measurement step, a measurement current flow having a current density of 1 mA/cm$^2$ to 500 mA/cm$^2$ is induced by illuminating the sun-facing side of the silicon solar cells and biasing, and a current strength of said measurement current flow is sensed using an ammeter and stored assigned to the respective measurement section.

20 Claims, No Drawings

METHOD FOR IMPROVING THE OHMIC CONTACT BEHAVIOR BETWEEN A CONTACT GRID AND AN EMITTER LAYER OF A SILICON SOLAR CELL

This application is a national stage of International Patent Application No. PCT/DE2021/000070, filed Apr. 1, 2021, which the claims the benefit of German Application No. DE 10 2020 002 335.5, filed Apr. 17, 2020.

The invention relates to a method for improving the ohmic-contact behaviour between a contact grid and an emitter layer of a silicon solar cell, in which, in one treatment step with a voltage source and a contacting device connected thereto, a voltage is applied between the contact grid and a back contact of the silicon solar cell that is contrary to the forward direction of the silicon solar cell and has a value lower than the breakdown voltage of the silicon solar cell and, when said voltage is applied, a point light source is guided over the sun-facing side of the silicon solar cell, whereby process treatment sections of sub-areas of the sun-facing side are illuminated and thus a treatment current flow is induced in the respective sub-area, and said treatment current flow has a current density of 200 A/cm$^2$ to 20,000 A/cm$^2$ in relation to the treatment section and acts on the sub-area for 10 ns to 10 ms.

In the course of the manufacturing process for crystalline silicon solar cells, a metal paste is screen-printed onto the front side, which is coated with dielectric silicon nitride, in the form of a contact grid. For contacting the emitter layer of the silicon solar cell lying below the silicon-nitride layer, a tempering step is carried out at 800-900° C. after applying the metal paste. In this step, the silver of the metal paste diffuses through the silicon-nitride layer into the emitter layer aided by a glass frit in the metal paste. The process control during the tempering step has a critical influence on contact formation. With correct process control, the transition between the contact grid and the emitter layer is characterized by a low contact resistance. With incorrect process control, only a high contact resistance is usually achieved. If, for example, the temperatures used in the tempering step are too low, the metal paste cannot diffuse sufficiently through the silicon-nitride layer, so that only a small contact area and thus a high contact resistance forms between the contact grid and the emitter layer. High contact resistances lead, in turn, to severe reductions in the efficiency of solar cells, so that they cannot then be installed in solar modules and are therefore rejects.

Prior art document DE 10 2018 001 057 A1 discloses a method for improving the ohmic-contact behaviour between a contact grid and an emitter layer of a silicon solar cell. In said method, a silicon solar cell is electrically biased contrary to its forward direction and scanned with a point light source in a treatment step. In the process, a treatment current flow having a current density of the order of 200 A/cm$^2$ to 20,000 A/cm$^2$ is generated in the respectively illuminated sub-area of the solar cell. The point light source is guided over the solar cell such that the treatment current flow acts on the sub-area for 10 ns to 10 ms. This current flow caused by the interaction of the illumination and the voltage directed contrary to the forward direction of the silicon solar cell results in an improvement in the ohmic-contact behaviour between the contact grid and the emitter layer of the silicon solar cell.

However, it is disadvantageous that, in order to quantify the improvement in the ohmic-contact behaviour achieved by the method, the solar cell must be electrically characterized after application of the method. Such a characterization can be, for example, the inclusion of the current-voltage characteristic of the solar cell under irradiation in a sun simulator, in which the improvement in the contact behaviour can be derived from the serial resistance of the silicon solar cell, which is determined from the current-voltage curve. However, measurement of the solar cell before and after the application of the known method makes the overall processing of the solar cells time consuming. Furthermore, the application of the method for improving the ohmic-contact behaviour can also result in damage to some solar cells, since, for example, different parameters (such as a shorter time of exposure to the current flow) could be applicable to some sub-areas of these solar cells compared to the remainder of these solar cells. The ohmic-contact behaviour between the contact grid and the emitter layer of the silicon solar cell can also vary locally, which fundamentally entails a corresponding change in the parameters when the known method is applied. Although such local variations in the parameters can be set using the known method, the regions of the silicon solar cell in which a corresponding local variation in the parameters is necessary are not known when the known method is applied.

The object of the invention is to improve the method for improving the ohmic-contact behaviour between a contact grid and an emitter layer of a silicon solar cell. In particular, it should be possible to quantify the improvement achieved by the method while implementing the method. Furthermore, any damage resulting from the application of unfavourable process parameters should be detected while the method is being implemented.

This object is achieved according to the invention by a method for improving the ohmic-contact behaviour between a contact grid and an emitter layer of a silicon solar cell with the characteristics of claim 1. Advantageous embodiments are presented in claims 2 to 20.

In the part of the method which is known per se, a silicon solar cell is first prepared with the emitter layer, the contact grid and a back contact. In one treatment step, a voltage directed contrary to the forward direction of the silicon solar cell and of a value lower than the breakdown voltage of the silicon solar cell is applied between the contact grid and the back contact by means of a contacting device and a voltage source. When this voltage is applied, a point light source is then guided over the sun-facing side of the silicon solar cell, whereby treatment sections of sub-areas of the sun-facing side are illuminated and thus a treatment current flow is induced in the respective sub-area, and this treatment current flow has a current density of 200 A/cm$^2$ to 20,000 A/cm$^2$ in relation to the treatment section and acts on the sub-area for 10 ns to 10 ms.

According to the invention, a measurement step is carried out before and/or after the treatment step. In said measurement step, a voltage is applied between the contact grid and the back contact using the voltage source and the contacting device. When said voltage is applied, measurement sections of sub-areas of the sun-facing side of the silicon solar cell are illuminated using the point light source, during which the voltage and an illumination intensity are set such that a measurement current flow is induced in the respective sub-area, with said measurement current flow having a current density of 1 mA/cm$^2$ to 500 mA/cm$^2$ in relation to the measurement section. The measurement current flow at the given voltage and illumination intensity is sensed using an ammeter and is stored assigned to the respective measurement section.

The current strengths measured for the respective measurement section are then available for further processing, for example for process monitoring, process control or quality control. Regions with a good ohmic-contact behaviour between the contact grid and the emitter layer or low local short-circuit currents contrast with regions having a poorer ohmic-contact behaviour by their higher current strength. Since the current strengths are stored assigned to the respective measurement section and/or treatment section, there is spatially resolved information for the electrical properties of the silicon solar cell. This spatially resolved information can then be used as control parameters for the treatment step. In the treatment step, an illumination intensity of the point light source and/or a time of exposure to the illumination and/or a level of the voltage directed contrary to the forward direction of the silicon solar cell can be adjusted during the illumination to influence the treatment current flow.

Depending on the desired measurement information, the voltage applied in the measurement step is directed contrary to the forward direction of the silicon solar cell and has a value lower than the breakdown voltage of the silicon solar cell, or the voltage applied in the measurement step is directed in the forward direction of the silicon solar cell.

In a further embodiment of the method according to the invention, the respective treatment current flow is likewise sensed using the ammeter and stored assigned to the respective treatment section during the treatment step for at least some of the illuminated treatment sections. The sensing of the strength of the measurement current flow and the sensing of the strength of the treatment current flow can take place optionally relative to each other. For example, it is possible for a measurement step to be carried out only before the treatment step, without the treatment current also being sensed during the treatment step and without a further measurement step following the treatment step. It is likewise possible for the treatment current flow to be sensed only during the treatment step, for example, without any measurement step being carried out either before or after the treatment step. It is also possible for a measurement step to be carried out before and after the treatment step and also for the treatment current flow to be sensed during the treatment step, or for measurement current flows to be sensed only during the measurement steps before and after the treatment step, without treatment currents being sensed during the treatment step.

The sensed and stored values of the treatment current flows are also then available for further processing, for example for process monitoring, process control or quality control.

In the method according to the invention, the strength of the measurement current flow is detected in the measurement step at a given voltage and given illumination intensity. It is generally known that an electrical measurement can also be carried out with a constant current and detection of the respective voltage, and therefore the measurement step of the method according to the invention can also be carried out such that a constant current flow is specified, and the respective voltage is sensed using a voltmeter and stored assigned to the respective measurement section or treatment section. Both forms of the measurement can therefore be regarded as equivalent in the object of the invention.

The method according to the invention is likewise not limited to the storage of the current strengths of the measurement current flows or treatment current flows assigned to the respective measurement section or treatment section. The storage can likewise take place in a converted form, for example as a current density, in which case the respective current strength is related to the area of the measurement section, for example. Or, for example, the current strength can be stored in relation to the applied voltage as a resistance value.

The voltage source and the contacting device in the measurement step can be the same ones as those used in the treatment step. This has the advantage that an additional contacting device is unnecessary. However, the invention is not limited to this. In principle, a different contacting device and/or a different voltage source from those used to sense the treatment current can also be used to sense the measurement current flow. With respect to the point light source, too, it is of course advantageous to use the same point light source both in the treatment step and in the measurement step, but the invention is not limited thereto, and in principle different point light sources can also be used.

The sensing of the treatment current flow and/or of the measurement current flow provides the possibility of using the sensed current flows as a measure of the quality of the ohmic-contact behaviour between the contact grid and the emitter layer. With constant illumination and applied voltage, a sub-area with a good ohmic-contact behaviour between the contact grid and the emitter layer will have a stronger measurement current flow than a sub-area with a poor ohmic-contact behaviour. With a measurement step before the treatment step, sub-areas with a poor ohmic-contact behaviour can be identified. For these regions, modified parameters are then provided for the voltage directed contrary to the forward direction of the silicon solar cell and the illumination intensity of the point light source during the treatment step, for example. Or only the sub-areas with poor ohmic-contact behaviour are processed during the treatment step, and the sub-areas which already exhibit a good ohmic-contact behaviour can be omitted from the treatment step.

Sensing of the measurement current flows after the treatment step can be used, for example, as a quality feature for the further processing of the silicon solar cell in the solar module.

With sensing of the measurement current flows both before and after the treatment step, the improvement in the ohmic-contact behaviour achieved by the treatment step can be determined in a spatially resolved manner. An improvement in the ohmic-contact behaviour manifests itself as an increase in the measurement current flow with constant parameters for voltage and illumination intensity. In this case, too, there is the possibility of identifying any sub-areas which have not yet reached the target values for a good ohmic-contact behaviour between the contact grid and the emitter layer and thus can be subjected to a further treatment step, limited to these sub-areas, in a targeted manner.

Furthermore, the treatment current flows measured and locally assigned in the treatment step can also be used for setting the parameters of the treatment step itself. For example, the current strength assigned to a treatment section can be used as a control parameter for setting the illumination intensity of the point light source and/or the time of exposure to the illumination and/or the level of the voltage directed contrary to the forward direction of the silicon solar cell during the illumination of a subsequent treatment section in the same treatment step.

It is likewise advantageous if, during the treatment step, a first current strength and subsequently a second current strength are sensed using the ammeter during the illumination of one of the treatment sections, and both current strengths are stored assigned to the treatment section. These two current strengths can then be used to calculate, for the respective treatment section, a current-strength gradient that can be used as a measure of the improvement in the ohmic-contact behaviour resulting from the treatment step for each treatment section. In this case, too, the current-strength gradient can be used either within a treatment step for controlling the parameters of a subsequent treatment section or else for a completely subsequent treatment step.

In addition to sensing the strength of measurement current flows or treatment current flows during illumination, a reverse current of the silicon solar cell can also be sensed with the silicon solar cell unilluminated in the previous and/or subsequent measurement step and/or in the treatment step and stored assigned to the respective treatment sections or measurement sections. The value of the reverse current is suitable for assessing possible damage to the silicon solar cell resulting from the application of the treatment step with unfavourable parameters. The reverse current is assessed using a reference value, which is compared, for example, to a reverse-current value obtained from an electrical characterisation of the silicon solar cell (e.g., recording of a current-voltage curve) prior to the method according to the invention. If, for example, the reverse current measured when the method according to the invention is applied is greater than the reverse-current value generated from the prior electrical characterization, this can indicate damage to the silicon solar cell resulting from disadvantageous parameters during the application of the improvement method. Such damage can be, for example, the production of short circuits within the silicon solar cell, which can be identified from an increase in the reverse current of the silicon solar cell.

In addition to the use of the reverse-current value generated from a prior electrical characterization, a reference value can also be a reverse current sensed in the measurement step preceding the treatment step. Or the reverse current can be measured in the treatment step before the illumination of at least some of the treatment sections.

In an advantageous embodiment, deviations of the reverse current from the respective reference reverse current can likewise be used as a control parameter for setting the illumination intensity and/or the time of exposure to the illumination and/or the level of the voltage directed contrary to the forward direction of the silicon solar cell during the illumination of at least some of the treatment sections. Likewise, a rejection criterion for the silicon solar cell can also be created by defining a threshold value of the reverse current after the treatment step and/or defining a threshold value for the change in the reverse current resulting from the treatment step, so that corresponding silicon solar cells can be withdrawn from further processing to avoid installing them in a solar module, for example.

When the reverse currents are sensed in the measurement step or treatment step, the voltage directed contrary to the forward direction that has a value lower than the breakdown voltage of the silicon solar cell can also be varied. A reverse current is thus defined for each given voltage and stored assigned to the respective measurement section or treatment section. Varying the voltage directed contrary to the forward direction allows the type of damage to the silicon solar cell to be identified, and therefore a distinction can be made, for example, between damage in the form of a crack in the silicon solar cell and damage resulting from increased charge-carrier recombination.

In further embodiments of the method, in the treatment step and/or in the measurement step, a proportion of the illumination reflected by the sun-facing side of the silicon solar cell is measured during the illumination of at least some of the treatment sections or measurement sections and is stored assigned to the respective section. Changes in the optical properties resulting from the treatment step can thus also be identified.

Advantageously, the wavelengths of the light radiation emitted by the point light source are changed during the illumination of the measurement sections in the measurement step and/or during the illumination of the treatment sections in the treatment step, and the current strengths are also sensed for this light radiation in the measurement step and/or treatment step and stored assigned to the respective section.

The same ammeter can advantageously be used for sensing the current strengths of the measurement current flows and/or the treatment current flows and/or the reverse currents. The invention is not limited thereto, however. Various meters can also be used, depending on the measurement range. For example, the current strengths of the treatment currents and the current strengths of the reverse currents differ by orders of magnitude, and therefore the use of two ammeters optimized for the respective ranges can be expedient here.

Different exemplary embodiments of the invention are explained below.

FIRST EXEMPLARY EMBODIMENT

In the method according to the invention for improving ohmic-contact behaviour between a contact grid and an emitter layer of a silicon solar cell, the silicon solar cell is first prepared with the emitter layer, the contact grid and a back contact. This can be, for example, a polycrystalline silicon solar cell having the dimensions 15.7 cm×15.7 cm, which is positioned on a processing table. The contact grid is then electrically connected to one pole of a voltage source and the back contact is electrically connected to the other pole of the voltage source by means of a contacting device. The contacting device can be equipped with, for example, spring-contact pins, which rest on the contact grid and on the back contact of the silicon solar cell and are connected to the voltage source via cable connections.

In a first measurement step, a voltage directed in the forward direction of the silicon solar cell is applied between the contact grid and the back contact via the contacting device using the voltage source. When this voltage is applied, individual measurement sections of sub-areas of the sun-facing side of the silicon solar cell are illuminated using a point light source. This point light source can be, for example, a laser or else a focused white-light source. As a result of the illumination, a measurement current flow is induced in the respective sub-area, the applied voltage and an illumination intensity of the point light source being set such that this measurement current flow has a current density of 1 mA/cm$^2$ to 500 mA/cm$^2$ in relation to the measurement section. For the illumination of the individual measurement sections, the light emitted by the point light source is then guided from measurement section to measurement section, the applied voltage and the illumination intensity of the point light source being kept constant. An ammeter and the contacting device are then used to measure the current flow in the silicon solar cell for each measurement section, with the sensed current strengths of the respective measurement current flow being stored assigned to the respective measurement section. The assignment of the measured current strength to the respective measurement section is carried out for example by storing the respective current strength together with the location coordinates of said measurement section on the sun-facing side of the silicon solar cell.

In a treatment step following the first measurement step, a voltage directed contrary to the forward direction of the silicon solar cell that has a value lower than the breakdown voltage of the silicon solar cell is applied by means of the voltage source and the contacting device. When this voltage is applied, the point light source already used in the measurement step is then guided over the sun-facing side of the silicon solar cell and, in the process, treatment sections of sub-areas of the sun-facing side are illuminated. As a result of the illumination, a current flow is induced in the respective sub-area. This current flow has a current density of 200 $A/cm^2$ to 20,000 $A/cm^2$ in relation to the section and acts on the sub-area for 10 ns to 10 ms. The current strength and the exposure time are set within this parameter window via a movement speed of the point light source relative to the silicon solar cell, an illumination intensity of the point light source, and the level of the voltage directed contrary to the forward direction of the silicon solar cell (but of a value less than the breakdown voltage). As a result of this treatment step, the ohmic-contact behaviour between the contact fingers and the emitter layer of the silicon solar cell is considerably improved, especially in regions that have high contact resistances between the contact grid and the emitter layer before the treatment step.

After the treatment step, a further, second measurement step, which is analogous to the first measurement step, is carried out. Again, the current strengths of the measurement current flows are sensed, preferably with parameters for voltage and illumination intensity identical to those during the first measurement step, and stored assigned to the respective measurement section. For each measurement section, there is then a value for the strength of the measurement current flow before the treatment step and a value for the strength of the measurement current flow after the treatment step. A spatially resolved quantification for the improvement in the ohmic-contact behaviour between the contact grid and the emitter layer is thus obtained from the change in the values of the respective measurement current. The change calculated from the measurement current flows can also be stored assigned to the respective measurement section. The silicon solar cell can then be submitted to a further treatment step depending on the result achieved (change in the strength of the measurement current flows). In this further treatment step, for example, only the treatment sections in which the corresponding measurement sections have not yet reached the specified change in the measurement current flows and/or a specified target value of the measurement current flow in the measurement steps are processed.

The voltage applied in the measurement steps can be directed contrary to the forward direction of the silicon solar cell and have a value lower than the breakdown voltage of the silicon solar cell, or the voltage applied in the measurement steps can be directed in the forward direction of the silicon solar cell.

SECOND EXEMPLARY EMBODIMENT

The measurement steps are carried out analogously to the first exemplary embodiment. In the treatment step, however, the parameters for the voltage directed contrary to the forward direction and the illumination intensity of the point light source are adjusted based on the current strengths of the measurement current flows sensed in the first measurement step.

Regions that exhibit low current strengths of the measurement current flow in the first measurement step are processed in the treatment step using a higher treatment current flow and/or a longer time of exposure to treatment current flow than regions that already exhibit a high current strength of the measurement current flow. The increase in the treatment current flow can be achieved via an increase in the voltage directed contrary to the forward direction and/or an increase in the illumination intensity of the point light source. An increase in the time of exposure to the treatment current flow is controlled via a dwell time of the point light source on the respective treatment section.

THIRD EXEMPLARY EMBODIMENT

In this case too, the measurement current flows are sensed during illumination of the measurement sections in the measurement steps and the treatment step is carried out correspondingly. Furthermore, in the second measurement step, before and/or after the illumination of at least a first part of the measurement sections, the sun-facing side of the silicon solar cell is left unilluminated, and a voltage directed contrary to the forward direction that has a value lower than the breakdown voltage of the silicon solar cell is applied between the contact grid and the back contact via the contacting device using the voltage source, so that a reverse current of the silicon solar cell is sensed using the ammeter when the voltage is applied. This reverse current is then stored assigned to the respective measurement sections. The respective reverse current can then be used as a characteristic value for any damage to the silicon solar cell resulting from the treatment step. To this end, the determined reverse currents of the measured measurement sections are compared with a reference reverse current obtained from an electrical characterization of the silicon solar cell prior to the method. This electrical characterization can be, for example, the inclusion of the current-voltage curve in the determination of the solar-cell efficiency, which is usual during the process of manufacturing the silicon solar cell. Advantageously, the reverse current is measured in the measurement step before or after the illumination of all the measurement sections.

The change in the reverse current determined in the second measurement step relative to the previously determined reference reverse current is used as a measure of the damage to the silicon solar cell resulting from the treatment step. If the reverse current of the silicon solar cell increases after the treatment step, it can be concluded that damage to the silicon solar cell has resulted from the treatment step.

FOURTH EXEMPLARY EMBODIMENT

The method proceeds analogously to the third exemplary embodiment. In contrast thereto, however, the reference reverse current is generated in the first measurement step. As in the second measurement step, before and/or after the illumination of at least a first part of the measurement sections, the sun-facing side of the silicon solar cell is left unilluminated so that a reverse current of the silicon solar cell is sensed using the ammeter when the voltage is applied. The change in the reverse current sensed in the second measurement step relative to the reverse current sensed in the first measurement step is then used as a measure of any damage to the silicon solar cell caused by the treatment step.

FIFTH EXEMPLARY EMBODIMENT

In addition to or instead of the sensing of the measurement current flows and/or reverse currents in the measurement steps, the actual current strengths of the treatment current flows are also sensed for at least some of the illuminated treatment sections in the treatment step and stored assigned to the respective treatment section. The current strength is sensed at the end of the time of exposure to the current flow on the respective sub-area. The treatment currents sensed for the treatment sections are used as a measure of the improvement in the ohmic-contact behaviour between the contact grid and the emitter layer achieved by the treatment step. If the treatment sections are processed with identical parameters for the voltage directed contrary to the forward direction of the silicon solar cell and illumination intensity of the point light source, regions having a better ohmic-contact relationship between the contact grid and the emitter layer manifest themselves in that the current strengths are higher at the end of the treatment of the respective treatment section. The treatment currents sensed and stored for the individual treatment sections are used, for example, as a quality characteristic in the further processing of the silicon solar cell. Likewise, the sensed and stored treatment currents can also be used for carrying out a further treatment step, in which case, for example, the regions with low measured treatment currents are processed again with changed parameters in a targeted manner in the further treatment step. The changed parameters in this case are again the illumination intensity of the point light source and/or the time of exposure to the illumination and/or the level of the voltage directed contrary to the forward direction of the silicon solar cell.

SIXTH EXEMPLARY EMBODIMENT

If, in contrast to the fourth exemplary embodiment, no measurement step is carried out before the treatment step, a reference reverse current can also be determined in the treatment step, for comparison with the reverse current determined in the second measurement step. To this end, in the treatment step, the sun-facing side of the silicon solar cell is left unilluminated before the illumination of the treatment sections, and the reverse current is sensed when the voltage directed contrary to the forward direction of the silicon solar cells is applied.

SEVENTH EXEMPLARY EMBODIMENT

In contrast to the aforementioned exemplary embodiments, it is possible for both the reference reverse current and the reverse current after the processing of the treatment sections to be measured only in the treatment step. To this end, in the treatment step, before the illumination of a first part of the treatment sections, the sun-facing side of the silicon solar cell is left unilluminated and the reverse current is sensed when the voltage directed contrary to the forward direction is applied. The first part of the treatment sections is then gradually illuminated. At the end of the illumination of the first part of the treatment sections, the sun-facing side of the silicon solar cell is again left unilluminated, and the reverse current is sensed again. The value of the reverse current sensed before the illumination of the first part of the treatment sections is then used as a reference value for the reverse current sensed after the illumination of the first part of the treatment sections.

If, in the treatment step, the sun-facing side of the silicon solar cell is scanned for example line by line using the point light source during processing of the treatment sections, the treatment sections lying along each line are illuminated successively. After each line, the point light source is switched off or guided away from the sun-facing side of the solar cell beyond the edge of the silicon solar cell in the switched-on state, so that the sun-facing side of the solar cell is completely unilluminated, and the reverse current can be sensed when the voltage directed contrary to the forward direction is applied. In each case, the reverse current sensed after the illumination of a line is then used as a reference reverse current for the reverse current generated after the illumination of a subsequent line. Any damage to the silicon solar cell can thus be assigned even to the processing of a certain line (or treatment sections).

EIGHTH EXEMPLARY EMBODIMENT

The processing is carried out analogously to the seventh exemplary embodiment. Furthermore, a change in the reverse currents generated before and after the illumination of a line is used as a control parameter for setting the parameters (illumination intensity of the point light source, time of exposure to the illumination, level of the voltage directed contrary to the forward direction) for the illumination of a subsequent line in the processing step. If, for example, an increase in the reverse current is detected, the parameters (for example time of exposure to the illumination) are changed for the illumination of the subsequent line such that a further increase in the reverse current is avoided.

In all the aforementioned exemplary embodiments, as a further embodiment, the voltage directed contrary to the forward direction can also be varied during sensing of the reverse currents in the measurement step or treatment step, provided said voltage still has a value lower than the breakdown voltage of the silicon solar cell. A reverse current is thus defined for each given voltage and stored assigned to the respective measurement section or treatment section.

NINTH EXEMPLARY EMBODIMENT

The treatment current flows (cf. fifth exemplary embodiment) of the treatment sections sensed in the treatment step are used to control the parameters for the processing of subsequent treatment sections. The control is conducted such that the treatment current flow sensed during processing of a treatment section is compared with a reference value. If the sensed treatment current flow is, for example, lower than this reference value, this can be a sign of a still insufficient improvement in the ohmic-contact behaviour between the contact grid and the emitter layer. In a subsequent treatment section, the parameters are therefore adjusted accordingly for the illumination of this treatment section.

TENTH EXEMPLARY EMBODIMENT

In contrast to the fifth exemplary embodiment, in which the current strength of the treatment current flow is in each case sensed at the end of the time of exposure to the current flow of the respective sub-area, in this case a first current strength is sensed first and a second current strength is sensed subsequently using an ammeter for each treatment section during the illumination thereof, and both current strengths are stored assigned to the treatment section. The change (gradient) in the current strength is used as a measure of the improvement in the ohmic-contact behaviour between the contact grid and the emitter layer. The increase in the current strength during the illumination of a treatment section indicates an improvement in the ohmic-contact behaviour. A small or absent increase in the current strength indicates only a small or absent improvement in the ohmic-contact behaviour. The change in the current strength during the illumination of a treatment section is therefore used for the control of the parameters (illumination intensity of the point light source, time of exposure to the illumination, level of the voltage directed contrary to the forward direction) of at least one subsequent treatment section. As well as being used as a control parameter, the gradient of the current strength is also stored assigned to the respective treatment section.

In all the exemplary embodiments listed, in the treatment step and/or in the measurement step, a proportion of the illumination reflected by the sun-facing side of the silicon solar cell is optionally measured during the illumination of at least some of the treatment sections or measurement sections and is stored assigned to the respective section. Furthermore, the wavelength of the light radiation emitted by the point light source is optionally changed during the sensing of the reflected proportion, the reflected proportion being sensed for specified wavelengths and stored assigned to the respective section. The wavelength of the light radiation emitted by the point light source is also optionally changed during sensing of the current strengths of the measurement current flows and/or the treatment current flows; in this case, too, the current strengths of the measurement current flows and/or the treatment current flows are each sensed for specified wavelengths and stored assigned to the respective section.

The invention claimed is:

1. A method for improving the ohmic-contact behavior between a contact grid and an emitter layer of a silicon solar cell, the method comprising:
    performing a treatment step comprising:
        applying a first voltage directed contrary to the forward direction of the silicon solar cell that has a value lower than a breakdown voltage of the silicon solar cell between the contact grid and a back contact of the silicon solar cell using a voltage source and a contacting device connected thereto; and
        while applying the first voltage, guiding a point light source is over a sun-facing side of the silicon solar cell thereby illuminating treatment sections of sub-areas of the sun-facing side and thus inducing a treatment current flow in a respective one of the sub-areas, wherein the treatment current flow has a current density of 200 A/cm$^2$ to 20,000 A/cm$^2$ in relation to the treatment sections and acts on one of the respective sub-areas for 10 ns to 10 ms;
    performing a measurement step before and/or after the treatment step, the measurement step comprising:
        applying a second voltage between the contact grid and the back contact using the voltage source and the contacting device; and
        while applying the second voltage, illuminating measurement sections of the sub-areas of the sun-facing side of the silicon solar cell using the point light source and thus inducing a measurement current flow in a respective one of the sub-areas, wherein the measurement current flow has a current density of 1 mA/cm$^2$ to 500 mA/cm$^2$ in relation to a respective one of the measurement sections;
        sensing a current strength of the measurement current flow using an ammeter;
        assigning the current strength of the measurement current flow to the respective one of the measurement sections; and
        storing the current strength of the measurement current flow.

2. The method of claim 1, further comprising sensing a current strength of the treatment current flow using an ammeter, and storing the strength of the treatment current flow assigned to the illuminated one of the treatment sections.

3. The method of claim 1, wherein
    the second voltage applied in the measurement step is directed contrary to the forward direction of the silicon solar cell and has a value lower than the breakdown voltage of the silicon solar cell, or
    the second voltage applied in the measurement step is directed in the forward direction of the silicon solar cell.

4. The method of claim 1, wherein the current strength of the measurement current flow assigned to a measurement section in the measurement step is used as a control parameter in the treatment step following the measurement step for setting an illumination intensity of the point light source and/or a time of exposure to the illumination and/or a level of the first voltage directed contrary to the forward direction of the silicon solar cell during the illumination of at least one of the treatment sections.

5. The method of claim 1, further comprising:
    determining a change in the current strength of a measurement section of the measurement sections sensed in a measurement step preceding the treatment step and the current strength of the measurement section sensed in a measurement step following the treatment step, and storing the change assigned to the measurement section.

6. The method of claim 5, further comprising using the change in the current strength assigned to a measurement section as a control parameter for a further treatment step for setting an illumination intensity of the point light source and/or a time of exposure to the illumination and/or a level of voltage directed contrary to the forward direction of the silicon solar cell during illumination of at least one of the treatment sections.

7. The method of claim 1, further comprising using the current strength assigned to a treatment section in the treatment step as a control parameter for setting an illumination intensity of the point light source and/or a time of exposure to the illumination and/or a level of voltage directed contrary to the forward direction of the silicon solar cell during illumination of a subsequent treatment section of the treatment step.

8. The method of claim 1, further comprising, in the treatment step, sensing a first current strength and subsequently a second current strength using the ammeter during illumination of one of the treatment sections, and storing the first current strength and the second current strength assigned to the illuminated one of the treatment sections.

9. The method of claim 8, further comprising determining a current-strength gradient from the first current strength and the second current strength.

10. The method of claim 9, further comprising using the current-strength gradient as a control parameter for setting an illumination intensity and/or a time of exposure to the illumination and/or a level of voltage directed contrary to the forward direction of the silicon solar cell during illumination of a subsequent treatment section in the treatment step.

11. The method of claim 1, wherein, in the treatment step, before and/or after illumination of at least a first part of the treatment sections, the sun-facing side of the silicon solar cell is unilluminated, and a reverse current of the silicon solar cell is sensed using the ammeter.

12. The method of claim 1, wherein, in the measurement step, before and/or after illumination of at least a first part of the measurement sections:
the sun-facing side of the silicon solar cell is unilluminated,
a voltage, directed contrary to the forward direction and has having a value lower than the breakdown voltage of the silicon solar cell, is applied between the contact grid and the back contact via the contacting device using the voltage source, and
a reverse current of the silicon solar cell is sensed using the ammeter and stored assigned to the measurement sections.

13. The method of claim 11, further comprising:
comparing the reverse current with a reference reverse current, and
using a deviation of the reverse current from the reference reverse current as a control parameter for setting an illumination intensity and/or a time of exposure to the illumination and/or a level of the voltage directed contrary to the forward direction of the silicon solar cell during illumination of a further part of the treatment sections of the sun-facing side of the silicon solar cell.

14. The method of claim 13, further comprising obtaining the reference reverse current from an electrical characterization of the silicon solar cell prior to performing the treatment step.

15. The method of claim 13, further comprising using the reverse current sensed in the treatment step before the illumination of a first part of the treatment sections as a reference reverse current for the reverse current sensed after the first part of the treatment sections.

16. The method of claim 13, wherein the reference reverse current used in the treatment step for a treatment section is the reverse current determined in the measurement step for a measurement section before the treatment step.

17. The method of claim 11, further comprising in the measurement step and/or in the treatment step for sensing the reverse current,
varying the voltage, which is directed contrary to the forward direction and which has a value lower than the breakdown voltage of the silicon solar cell.

18. The method of claim 1, further comprising, in the treatment step and/or in the measurement step,
measuring a proportion of illumination reflected by the sun-facing side of the silicon solar cell during the illumination of at least some of the treatment sections or the measurement sections; and
assigning the proportion of the reflected illumination to the respective one of the treatment sections or measurement sections; and
storing the proportion of the reflected illumination.

19. The method of claim 1, further comprising, in the treatment step and/or in the measurement step:
changing the wavelength of light radiation emitted by the point light source during the illumination of the treatment sections or the measurement sections; and
measuring a proportion of illumination reflected by the sun-facing side of the silicon solar cell; and
assigning the proportion of the reflected illumination to the respective one of the treatment sections or measurement sections; and
storing the proportion of the reflected illumination.

20. The method of claim 1, further comprising:
changing the wavelength of light radiation emitted by the point light source during the measurement step and/or in the treatment step;
sensing a current strength of a second measurement current flow induced by the changed light radiation emitted by the point light source in the measurement step and/or treatment step; and
storing the current strength of the second measurement current flow.

* * * * *